US006773853B2

(12) United States Patent
Minami et al.

(10) Patent No.: US 6,773,853 B2
(45) Date of Patent: Aug. 10, 2004

(54) SEMICONDUCTOR DEVICE MANUFACTURE METHOD WITH EXPOSURE PROCESS USING SMALL EXPOSURE AMOUNT, AND RETICLE SET FOR SEMICONDUCTOR DEVICE MANUFACTURE

(75) Inventors: Takayoshi Minami, Kawasaki (JP); Toshio Sawano, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 153 days.

(21) Appl. No.: 09/985,004

(22) Filed: Nov. 1, 2001

(65) Prior Publication Data

US 2002/0182545 A1 Dec. 5, 2002

(30) Foreign Application Priority Data

May 30, 2001 (JP) ........................................ 2001-161999

(51) Int. Cl.⁷ ............................ G03F 9/00; G03F 7/00
(52) U.S. Cl. .............................. 430/5; 430/22; 430/311; 430/394
(58) Field of Search .............................. 430/5, 22, 311, 430/394, 30; 438/462, 975

(56) References Cited

U.S. PATENT DOCUMENTS 5,446,521 A * 8/1995 Hainsey et al. ................ 355/53
5,753,417 A * 5/1998 Ulrich ......................... 430/312
6,068,954 A * 5/2000 David ........................... 430/22

OTHER PUBLICATIONS

H–Y liu et al.; "The Application of Alternating Phase Shifting Masks to 140 nm Gate Patterning . . . "; SPIE, v.3334, (1998), pp. 2–14.*

A.Yanof.; "Techniques and Tools for Photometrology". in Handbook for VLSI Microlithography, eds: G.E.McGuire, Noyes (NY,1988) ch.4; pp. 382–470.*

* cited by examiner

Primary Examiner—Mark F. Huff
Assistant Examiner—K. Sagar
(74) Attorney, Agent, or Firm—Armstrong, Kratz, Quintos, Hanson & Brooks, LLP

(57) ABSTRACT

First and second areas are defined on the substrate. A partial area of a resist film formed on the surface of the substrate is exposed to light having a first intensity, the partial area corresponding to an area above first area, and the light having the first intensity having transmitted through a pattern of a first reticle to be transferred. The resist film above the second area of the substrate is exposed to light having a second intensity weaker than the first intensity. The resist film above the first and second areas is exposed to light having a third intensity weaker than the first intensity, the light having the third intensity having transmitted through a pattern of a second reticle to be transferred. The exposed resist film is developed.

24 Claims, 8 Drawing Sheets

FIG. 3

| EMBODI-MENTS | UNDERLYING PATTERN | NORMAL EXPOSURE AMOUNT RETICLE | | LOW EXPOSURE AMOUNT RETICLE | | UPPER LAYER PATTERN |
|---|---|---|---|---|---|---|
| | | MARGIN PATTERN | OVERLAY MEASUREMENT MARK AREA | MARGIN PATTERN | OVERLAY MEASUREMENT MARK AREA | |
| 1 | MAIN ALIGNMENT MARK | LIGHT SHIELD | PARTIAL TRANSMISSION FILM OR FINE PATTERN | LIGHT SHIELD | SUBSIDIARY ALIGNMENT MARK | |
| 2 | | ↑ | ↑ | ↑ | MAIN ALIGNMENT MARK | SUBSIDIARY ALIGNMENT MARK |
| 3 | | ↑ | MAIN ALIGNMENT MARK IN PARTIAL TRANSMISSION AREA | ↑ | SUBSIDIARY ALIGNMENT MARK | |
| 4 | | ↑ | MAIN ALIGNMENT MARK OF BOX TYPE MADE OF FINE PATTERN | ↑ | ↑ | |
| 5 | MAIN ALIGNMENT MARK | PARTIAL TRANSMISSION FILM OR FINE PATTERN | LIGHT SHIELD | ↑ | ↑ | |
| 6 | | ↑ | ↑ | ↑ | MAIN ALIGNMENT MARK | SUBSIDIARY ALIGNMENT MARK |
| 7 | | ↑ | MAIN ALIGNMENT MARK | ↑ | SUBSIDIARY ALIGNMENT MARK | |
| 8 | MAIN ALIGNMENT MARK | ↑ | LIGHT SHIELD | TRANSMISSION | ↑ | |
| 9 | | ↑ | MAIN ALIGNMENT MARK | ↑ | MAIN ALIGNMENT MARK | SUBSIDIARY ALIGNMENT MARK |
| 10 | MAIN ALIGNMENT MARK | PARTIAL TRANSMISSION FILM | LIGHT SHIELD | LIGHT SHIELD | SUBSIDIARY ALIGNMENT MARK | |
| 11 | MAIN ALIGNMENT MARK | ↑ | PARTIAL TRANSMISSION FILM | PARTIAL TRANSMISSION FILM | MAIN ALIGNMENT MARK | SUBSIDIARY ALIGNMENT MARK |
| 12 | ↑ | LIGHT SHIELD | LIGHT SHIELD | ↑ | SUBSIDIARY ALIGNMENT MARK | |
| 13 | | ↑ | MAIN ALIGNMENT MARK | ↑ | ↑ | |
| 14 | | ↑ | LIGHT SHIELD | ↑ | MAIN ALIGNMENT MARK | SUBSIDIARY ALIGNMENT MARK |

FIG.4
| EMBODI-MENTS | UNDERLYING PATTERN | OVERLAY MEASUREMENT MARK AREA FOR NORMAL EXPOSURE AMOUNT | OVERLAY MEASUREMENT MARK AREA FOR LOW EXPOSURE AMOUNT |
|---|---|---|---|
| REFERENCE EXAMPLE | 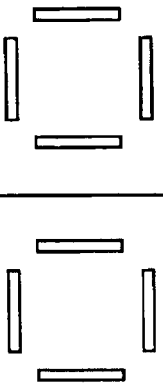 | 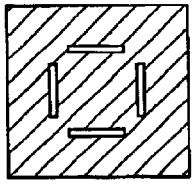 | 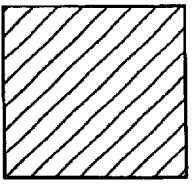 |
| 1 | 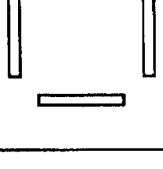 | 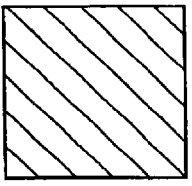 | 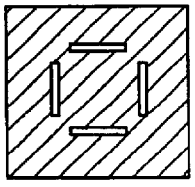 |
| 2 | | 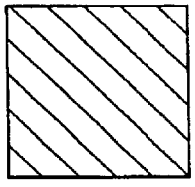 | 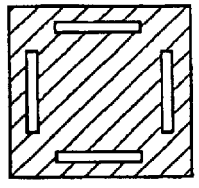 |
| 3 | | 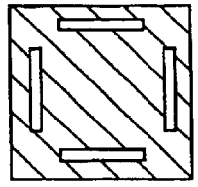 | 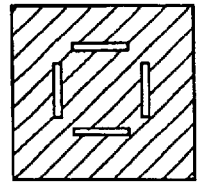 |
| 4 | | 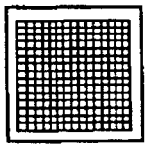 | 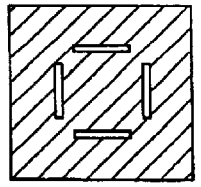 |

# SEMICONDUCTOR DEVICE MANUFACTURE METHOD WITH EXPOSURE PROCESS USING SMALL EXPOSURE AMOUNT, AND RETICLE SET FOR SEMICONDUCTOR DEVICE MANUFACTURE

CROSS REFERENCE TO RELATED APPLICATION

This application is based on and claims priority on Japanese patent application 2001-161999, filed on May 30, 2001, the whole contents of which are incorporated herein by reference.

BACKGROUND OF THE INVENTION

A) Field of the Invention

The present invention relates to a semiconductor device manufacture method and a reticle set for semiconductor device manufacture, and more particularly to a semiconductor device manufacture method in which one layer is exposed by using a plurality of reticles, and to a reticle set for such exposure.

B) Description of the Related Art

With the recent development of fine patterning of semiconductor integrated circuit devices, it becomes necessary to form fine wiring lines disposed at a minute pitch. In order to form such fine wiring lines, techniques have been introduced which expose one wiring layer by using a plurality of reticles. Such techniques known to date are, for example, phase edge techniques for shortening a gate length, techniques for forming a fine pitch pattern by exposing a double pitch pattern twice by displacing it by a half pitch, and the like.

A conventional process of forming one wiring layer by using a plurality of reticles will be described. A thin film is first formed on the surface of a semiconductor wafer, and photoresist is coated on this thin film. The position of a first reticle is aligned with the wafer, and then the resist film on the wafer is exposed by using the reticle to transfer a reticle pattern. Similarly, the second and following reticle patterns are transferred.

After the patterns of all reticles are transferred, a development process is performed to form a resist pattern. After the development process, a surface test, a pattern size test and a reticle position alignment test are executed. In the pattern size test, the pattern size of each reticle is compared with a reference size. In accordance with this comparison results, it is checked whether the pattern of each reticle was transferred under the proper exposure and focus conditions.

In the position alignment test, a placement error between an overlay measurement mark formed on the underlying layer and an overlay measurement mark formed on the resist pattern and a placement error between resist patterns transferred by different reticles are measured to thereby check whether a position alignment with the underlying pattern and a position alignment of patterns in the same layer are proper.

There is a variation in proper exposure amounts of a plurality of reticles to be used. For example, a proper exposure amount is different for each type of masks such as a halftone phase shift mask, a binary mask and a Levenson type phase shift mask. A proper exposure amount also changes with the value of σ and the optical conditions such as oblique incidence illumination. A proper exposure amount also changes with the purpose of a mask, such as a main mask used mainly for forming a pattern and an auxiliary mask having a role of assisting the main mask.

Some reticles have a proper exposure amount smaller than a threshold value necessary for developing a resist film. When such a reticle is used, an alignment mark or overlay measurement mark cannot be resolved. An alignment mark is a mark used as a position alignment reference when an upper level wiring layer is formed. An overlay measurement mark is a mark used for testing a placement error between the pattern transferred by the reticle and a pattern of the underlying layer, same layer or upper layer.

A pattern transferred by a reticle having a lower proper exposure amount cannot be aligned directly with an upper pattern, because an alignment mark cannot be formed. Since an overlay measurement mark cannot be formed, it is not possible to test whether there is a placement error between a pattern transferred by a reticle having a lower proper exposure amount and another pattern.

SUMMARY OF THE INVENTION

It is an object of the present invention to provide a semiconductor device manufacture method capable of forming an alignment mark and an overlay measurement mark even if a reticle having a lower proper exposure amount is used.

It is another object of the invention to provide a reticle set to be used for such a semiconductor device manufacture method.

According to one aspect of the present invention, there is provided a method of manufacturing a semiconductor device, comprising: a first exposure step of exposing a partial area of a resist film formed on a surface of a substrate to light having a first intensity, first and second areas being defined on the surface of the substrate, the partial area being above the first area, and the light having the first intensity having transmitted through an area on a first reticle where a pattern to be transferred is formed; a second exposure step of exposing the resist film above the second area of the substrate to light having a second intensity weaker than the first intensity; a third exposure step of exposing the resist film above the first and second areas to light having a third intensity weaker than the first intensity, the light having the third intensity having transmitted through an area of a second reticle where a pattern to be transferred is formed; and a developing step of developing the resist film exposed.

In the second exposure step, an exposure amount of the resist film is increased. When a pattern is transferred to the area where the exposure amount is increased, the transferred pattern can be resolved.

According to another aspect of the present invention, there is provided a reticle set for semiconductor device manufacture, comprising: first and second reticles for exposing one layer formed on a substrate having a plurality of sections defined on a surface of the substrate, each section being exposed by one shot, an outer peripheral area of each section overlapping an outer peripheral area of a section adjacent to the first-mentioned section, this overlap area corresponding to a scribe line; and wherein: when a first section among first and second sections adjacent to each other is exposed, each of mark areas of the first and second reticles corresponds to the scribe line corresponding to the overlap area of the first and second sections, when the second section is exposed, each of margin areas of the first and second reticles corresponds to the scribe line corresponding to the overlap area of the first and second sections;

a fifth mark is disposed in the mark area of the second reticle; and an area of the mark area of the first reticle corresponding to an area including a pattern transferred from the fifth mark on the substrate is a partial transmission area for partially transmitting exposure light.

When exposure is performed by using the first reticle, the resist film is exposed to light whose intensity was weakened by transmitting through the partial transmission area in the mark area. This exposure increases the exposure amount. It is therefore possible to obtain an exposure amount sufficient for resolving the fourth mark of the second reticle.

According to another aspect of the present invention, there is provided a reticle set for semiconductor device manufacture, comprising: first and second reticles for exposing one layer formed on a substrate having a plurality of sections defined on a surface of the substrate, each section being exposed by one shot, an outer peripheral area of each section overlapping an outer peripheral area of a section adjacent to the first-mentioned section, this overlap area corresponding to a scribe line; and wherein: when a first section among first and second sections adjacent to each other is exposed, each of mark areas of the first and second reticles corresponds to the scribe line corresponding to the overlap area of the first and second sections, when the second section is exposed, each of margin areas of the first and second reticles corresponds to the scribe line corresponding to the overlap area of the first and second sections; a seventh mark is disposed in the mark area of the second reticle; and an area of the margin area of the first reticle corresponding to an area including a pattern, on the substrate, transferred from the seventh mark is a partial transmission area for partially transmitting exposure light.

When exposure is performed by using the first reticle, the resist film is exposed to light whose intensity was weakened by transmitting through the partial transmission area in the margin area. This exposure increases the exposure amount. It is therefore possible to obtain an exposure amount sufficient for resolving the seventh mark of the second reticle.

According to another aspect of the present invention, there is provided a reticle set for semiconductor device manufacture, comprising: first and second reticles for exposing a resist layer formed on a surface of a substrate having a plurality of sections defined on the surface of the substrate, each section being exposed by one shot, an outer peripheral area of each section overlapping an outer peripheral area of a section adjacent to the first-mentioned section, this overlap area corresponding to a scribe line; and wherein: when a first section among first and second sections adjacent to each other is exposed, each of mark areas of the first and second reticles corresponds to the scribe line corresponding to the overlap area of the first and second sections, when the second section is exposed, each of margin areas of the first and second reticles corresponds to the scribe line corresponding to the overlap area of the first and second sections; said first reticle is formed with a pattern for exposing the resist film to light having an intensity supplying an exposure amount equal to or larger than a threshold level of developing the resist film, and said second reticle is being formed with a pattern for exposing the resist film to light having an intensity supplying an exposure amount lower than the threshold level; and an eighth mark is disposed in the mark area of said second reticle, and an area of the margin area corresponding to an area including a pattern, on the substrate, transferred from the eighth mark is a partial transmission area for partially transmitting exposure light.

Since the resist mask is exposed to light having transmitted through the margin area of the second reticle, the exposure amount is increased. It is therefore possible to obtain an exposure amount sufficient for resolving the eighth mark of the second reticle.

As above, since the total exposure amount is increased, an alignment mark or overlay measurement mark can be transferred by using a reticle which is used under the condition of an exposure amount lower than the development threshold value.

BRIEF DESCRIPTION OF THE DRAWINGS

FIG. 3 is a table showing the structures of margin patterns and overlay measurement mark areas of normal exposure amount reticles and low exposure amount reticles and the structures of underlying patterns and upper layer patterns, respectively used by semiconductor device manufacturing methods according to first to tenth embodiments.

FIG. 4 is a table showing the structures of underlying patterns and overlay measurement mark areas of normal exposure amount reticles and lower exposure amount reticles, respectively used by a reference example and the semiconductor device manufacture methods according to the first to fourth embodiments.

DETAILED DESCRIPTION OF THE PREFERRED EMBODIMENTS

Figure 1A:
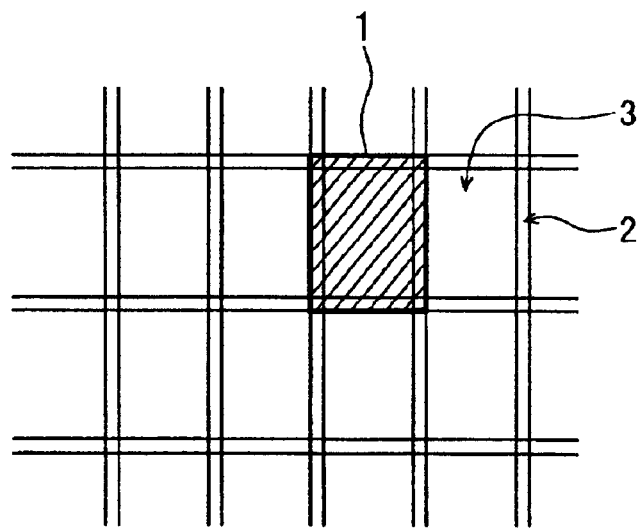
FIG. 1A is a diagram showing one shot exposure section on the surface of a wafer which is exposed by a reduction projection.
Figure 1B:
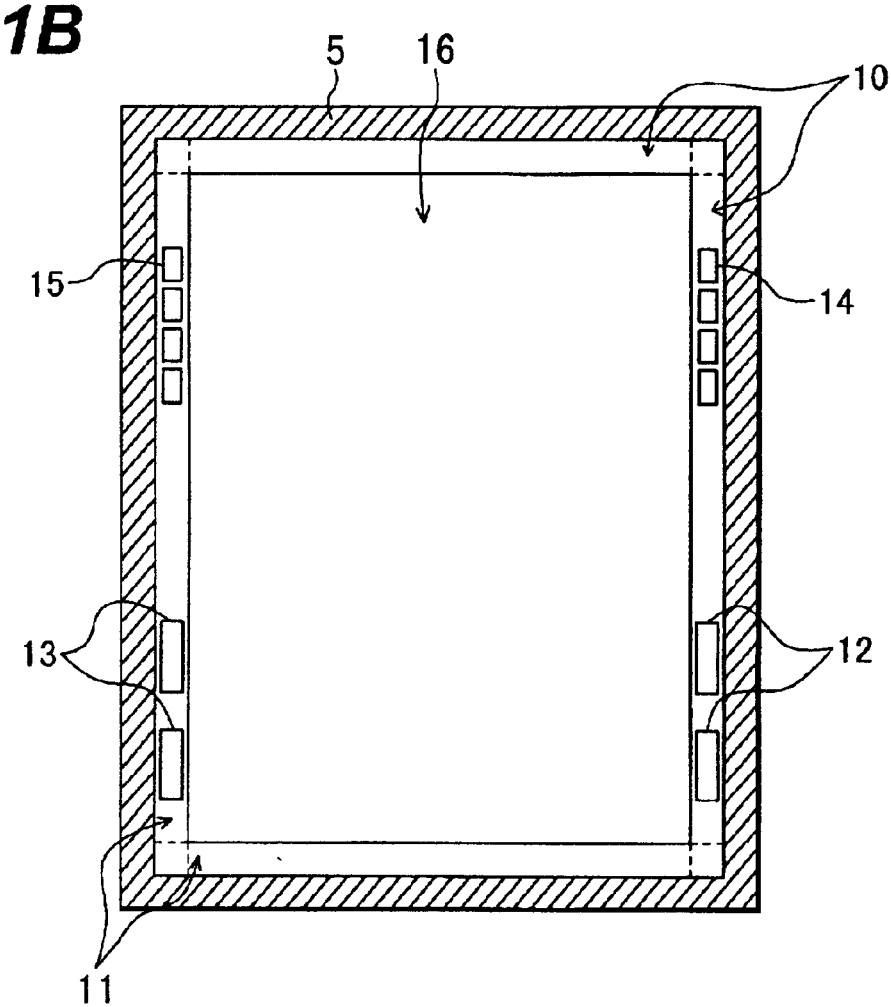
FIG. 1B is a plan view of a reticle.

With reference to FIGS. 1A and 1B, the relation between a reticle and a wafer used by semiconductor device manufacture methods according to the embodiments of the invention will be described.

FIG. 1A shows the layout of a rectangular or square section 1 (a hatched area corresponds to one section) defined on the surface of a semiconductor wafer to be exposed. An area in one section 1 is exposed by one shot. The outer peripheral area 2 of each section 1 overlaps the outer peripheral areas of sections adjacent to the section 1. A circuit pattern area 3 in which electronic circuit patterns are formed is disposed inside the outer peripheral area 2. The outer peripheral area 2 generally coincides with a scribe line along which the wafer is divided into chips.

FIG. 1B is a plan view showing an example of a reticle used with a reduction projection. Inside a light shielding area 5 disposed in an outer peripheral area of the reticle, a rectangular or square pattern area is disposed formed with an exposure pattern. In this pattern area, an elongated mark area 10 along adjacent two sides and an elongated margin area 11 along other adjacent two sides are disposed. A circuit pattern area 16 is disposed inside the mark area 10 and margin area 11.

During exposure, light transmitted through the mark area 10 and margin area 11 is applied to the outer peripheral area 2 shown in FIG. 1A, whereas light transmitted through the circuit pattern area 16 is applied to the circuit pattern area 3 of the wafer. As a plurality of sections 1 of the wafer are sequentially exposed, the outer peripheral area along one side is once exposed by light transmitted through the mark area 10, and again exposed by light transmitted through the margin area 11. The order of exposure may be reversed.

An alignment mark area 12 and an overlay measurement mark area 14 are disposed in the mark area 10. In the alignment mark area 12, an alignment mark is formed, and in the overlay measurement mark area 14, an overlay measurement mark is formed. An alignment mark margin pattern 13 is disposed in the margin area 11 in an area inclusive of the alignment mark transferred to the outer peripheral area 2 of the wafer. Similarly, an overlay measurement mark margin pattern 15 is disposed in the margin area 11 in an area inclusive of the overlay measurement mark transferred to the outer peripheral area 2 of the wafer. The structures of the alignment mark, overlay measurement mark, alignment mark margin pattern 13 and overlay measurement mark margin pattern 15 will be later detailed.

Figure 2:
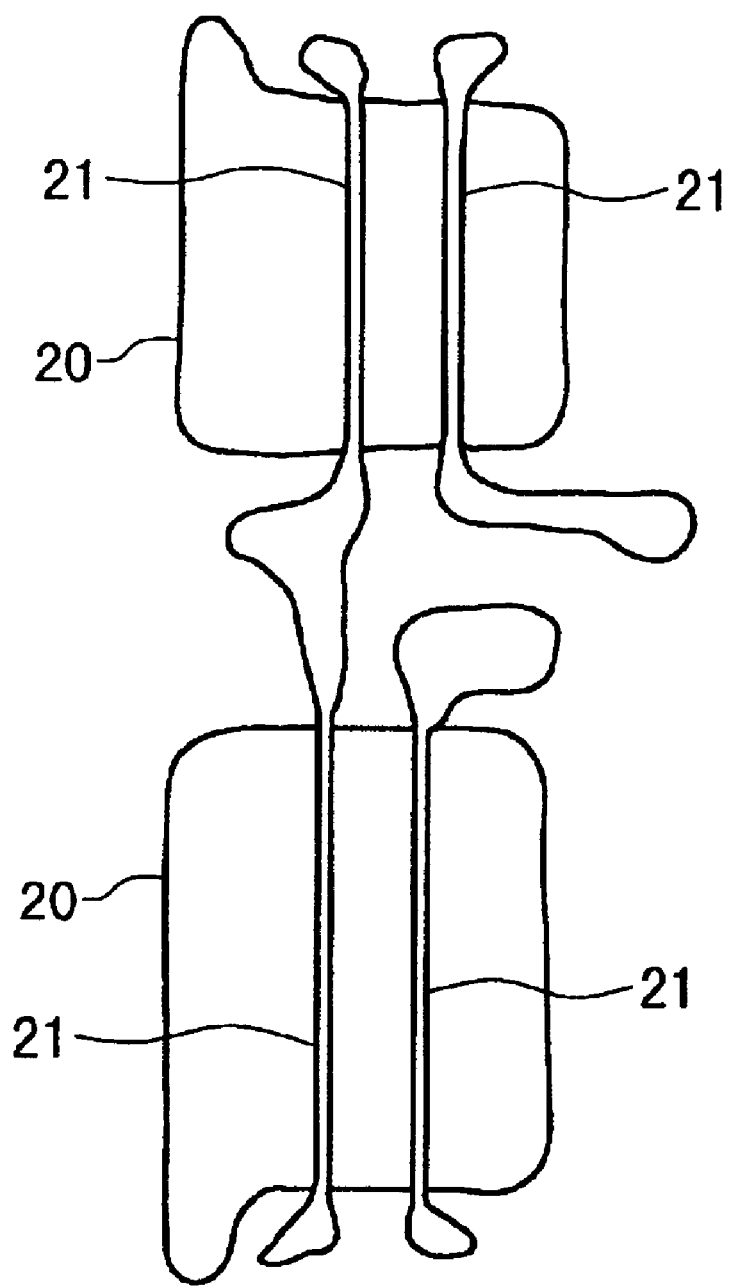
FIG. 2 is a plan view showing an example of a gate electrode pattern.

FIG. 2 is a plan view showing an example of a semiconductor integrated circuit device having a gate electrode formed by using two reticles. Active regions 20 are defined in a semiconductor substrate. A plurality of gate electrodes 21 are formed crossing the active region 20. A method of forming the gate electrode 21 will be described.

Positive resist is coated on the surface of a conductive film such as a polysilicon film constituting the gate electrode layer. First exposure is performed by using a halftone phase shift mask to form a gate pattern having a gate length longer than a final gate length. In this case, patterns other than the gate electrode pattern in the same layer are also exposed. Next, second exposure is performed by using a Levenson type phase shift mask to expose the gate electrode area to shorten the gate length. Exposure using the halftone phase shift mask provides an exposure amount sufficient for developing the resist film by one shot. In contrast, exposure using the Levenson type phase shift mask is performed by using weak light so that the exposure amount becomes smaller than the threshold value for developing the resist film.

Next, with reference to FIGS. 3 to 8, the structures of the overlay measurement mark area 14 and overlay measurement mark margin pattern 15 of the reticle shown in FIG. 1B will be described. Normal exposure amount reticles and low exposure amount reticles shown in FIGS. 3, 4, 6 and 7 correspond to a halftone phase shift mask and a Levenson type phase shift mask, respectively, to be used, for example, for forming the gate electrode shown in FIG. 2. In FIGS. 4 to 7, left lowering hatch lines indicate a light shield area and right lowering hatch lines indicate a partial transmission area.

FIG. 3 shows the structure of various marks according to first to tenth embodiments. The first, fifth and eighth embodiments provide the structures of marks and patterns for testing a placement error between an overlay measurement mark (main overlay measurement mark) of an underlying pattern and an overlay measurement mark (subsidiary overlay measurement mark) transferred from a low exposure amount reticle. The third, fourth, seventh and ninth embodiments provide the structures for testing a placement error between an overlay measurement mark (main overlay measurement mark) transferred from a normal exposure amount reticle and an overlay measurement mark (subsidiary overlay measurement mark) transferred from a low exposure amount reticle.

The second, sixth and tenth embodiments provide the structures for testing a placement error between an overlay measurement mark (main overlay measurement mark) transferred from a low exposure amount reticle and an overlay measurement mark (subsidiary overlay measurement mark) of an upper level layer.

A reference example shown in FIG. 4 shows an example for testing a placement error between an overlay measurement mark (main overlay measurement mark) of an underlying layer and an overlay measurement mark (subsidiary overlay measurement mark) transferred from a normal exposure amount reticle. The main overlay measurement mark is disposed in the light shielding area, and constituted of four straight line transmission areas (film-removed patterns) along fours sides of a square excepting four corner areas. The subsidiary overlay measurement mark is disposed in the overlay measurement mark area of the normal exposure amount reticle, and constituted of four straight line patterns along four sides of a square smaller than the square of the main overlay measurement mark excepting four corner areas. The subsidiary overlay measurement mark comprises a transmission area disposed in the light shielding area.

The overlay measurement mark area corresponding to the low exposure amount reticle is light-shielded. The overlay measurement mark margin patterns of the normal exposure amount reticle and low exposure amount reticle are made of a light shield film. By performing exposure using a normal exposure amount reticle, the subsidiary overlay measurement mark can be resolved. The main and subsidiary overlay measurement marks have the same patterns as those of the reference example, except as specifically notified. This overlay measurement mark is a bar in bar type mark.

In the first to fourth embodiments, the margin patterns of the normal exposure amount reticle and low exposure amount reticle are both made of a light shield film of Cr or the like.

First, the first embodiment will be described. As shown in the row of the first embodiment shown in FIG. 4, the main overlay measurement mark is formed on the surface of an underlying layer. The subsidiary overlay measurement mark is formed in the testing area of the low exposure amount reticle. The subsidiary mark is constituted of a transmission area disposed in the light shield area. In the overlay measurement mark area corresponding to the normal exposure amount reticle, a partial transmission film having a transmission factor of 2% to 50% is formed. For example, the partial transmission film is made of MoSiON.

Figure 8:
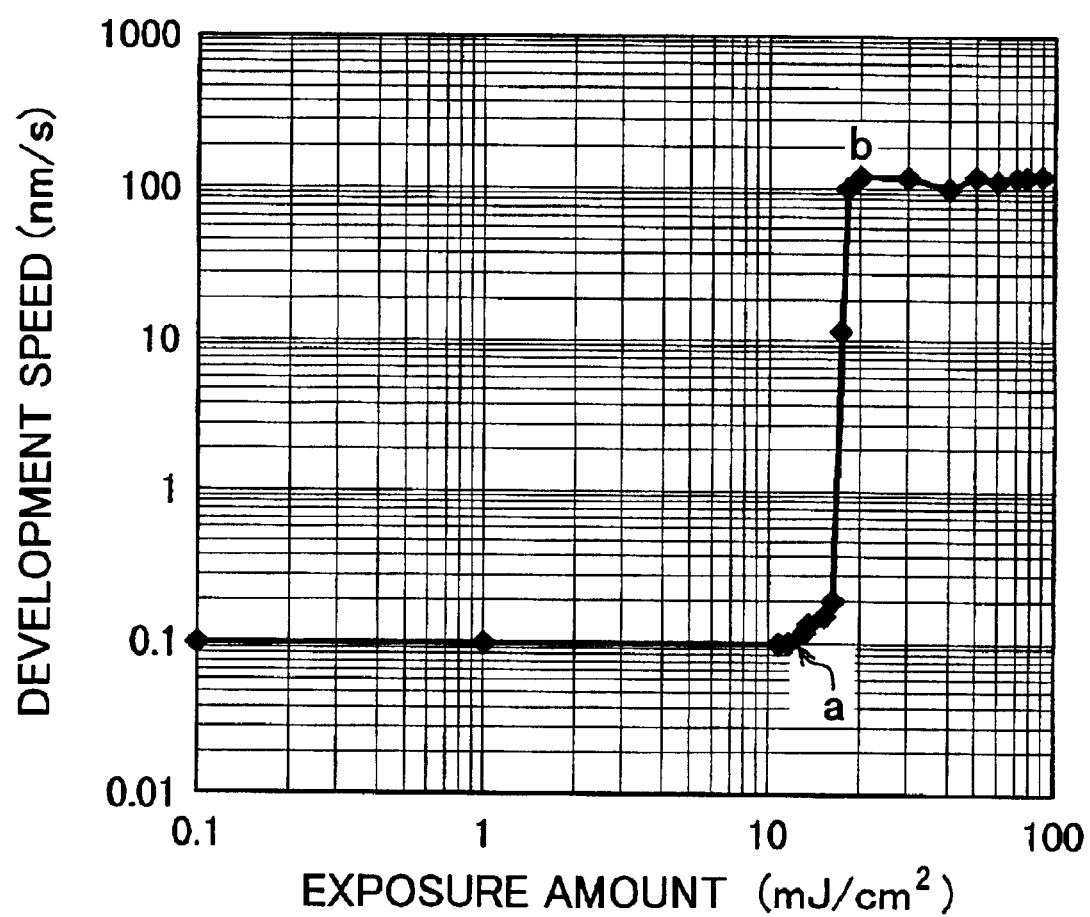
FIG. 8 is a graph showing an example of the relation between an exposure amount and a developing speed of positive resist.

FIG. 8 shows an example of a DR curve of a positive resist film. The abscissa represents an exposure amount in the unit of $mJ/cm^2$, and the ordinate represents a development speed in the unit of nm/s. As the exposure amount exceeds a point a, the development speed rapidly increases and nearly saturates at a point b. The exposure amount at the point a is herein called a non-development upper limit threshold value, and the exposure amount at the point b is called a development lower limit threshold value.

The transmission factor of the partial transmission film is adjusted so that the exposure amount of light weakened by transmitting through the overlay measurement mark area of the normal exposure amount reticle of the first embodiment shown in FIG. 4 becomes equal to or lower than the non-development upper limit threshold value. When exposure is performed by using the low exposure amount reticle, the intensity of exposure light is low so that the exposure amount of the resist film corresponding to the reticle transmission area is equal to or lower than the non-development upper limit threshold value. Therefore, only the exposure using the low exposure amount reticle cannot resolve the subsidiary overlay measurement mark.

In the first embodiment, the resist film in an area where the subsidiary mark is transferred is exposed by light weakened by transmitting through the overlay measurement mark area of the normal exposure amount reticle to increase the total exposure amount. The transmission factor of the overlay measurement mark area of the normal exposure amount is adjusted so that the total of the exposure amount of light weakened by transmitting through the overlay measurement mark area of the normal exposure amount reticle and the exposure amount of light transmitted through the transmission area of the low exposure amount reticle becomes equal to or larger than the development lower limit threshold value. It is therefore possible to resolve the subsidiary mark. By measuring a placement error between the main overlay measurement mark of the underlying layer and the subsidiary overlay measurement mark, a placement error of the low exposure amount reticle can be evaluated.

In the first embodiment, the partial transmission film is formed in the overlay measurement mark area of the normal exposure amount reticle. In place of the partial transmission film, a fine pattern whose size is equal to or smaller than the resolution limit may be formed. For example, a mesh pattern shown in FIG. 5A or a stripe pattern shown in FIG. 5B may be formed. The partial transmission film used with a halftone phase shift mask is subjected to restriction of a transmission factor in order to obtain a desired phase shift amount. However, by using a fine pattern, the transmission factor can be adjusted easily.

In the second embodiment shown in FIGS. 3 and 4, the main overlay measurement mark of the underlying layer of the first embodiment is not used. The other structures are the same as the first embodiment. In this case, the overlay measurement mark transferred from the low exposure amount reticle is utilized as the main overlay measurement mark for testing a relative position of the pattern to be formed in the upper layer.

In the third embodiment shown in FIGS. 3 and 4, the overlay measurement mark area of the normal exposure amount reticle is utilized as the partial transmission area with the partial transmission film, and in this partial transmission area, the main overlay measurement mark made of the transmission area is formed. The main overlay measurement mark is constituted of film-removed patterns formed through the partial transmission film. The structure of the overlay measurement mark area of the low exposure amount reticle is similar to the first embodiment. In this case, during exposure using the normal exposure amount reticle, exposure sufficient for resolving the main overlay measurement mark is performed. At the same time, the area corresponding to the subsidiary overlay measurement mark is exposed at the exposure amount equal to or lower than the non-development upper limit threshold value to increase the total exposure amount. It is therefore possible to resolve the subsidiary overlay measurement mark. By measuring a placement error between the main overlay measurement mark and subsidiary overlay measurement mark, a placement error between the normal exposure amount reticle and low exposure amount reticle can be evaluated.

In the fourth embodiment shown in FIGS. 3 and 4, in place of the main overlay measurement mark of the third embodiment, an overlay measurement mark of a box type is used. The structure of the overlay measurement mark of the low exposure amount reticle is similar to the third embodiment. The overlay measurement mark of the box type defines an outer peripheral edge as its reference position. The overlay measurement mark of the box type of the fourth embodiment is constituted of fine mesh patterns having a defined outer periphery and the size equal to or smaller than the resolution limit. Also in this case, the advantageous effects similar to the third embodiment can be obtained.

Figure 5A:
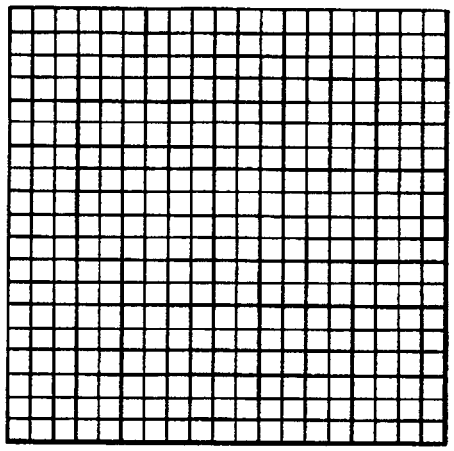
FIGS. 5A to 5D are schematic diagrams showing the structures of overlay measurement mark margin patterns and overlay measurement mark areas of normal exposure amount reticles.
Figure 5B:
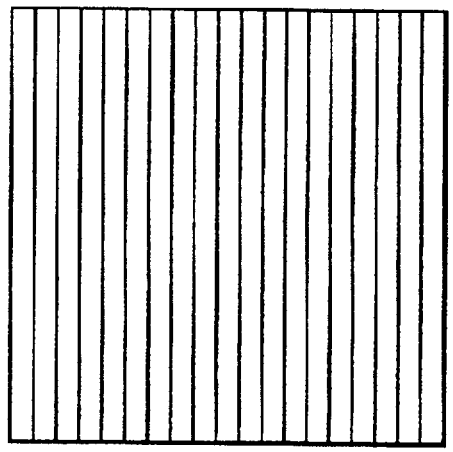
Figure 5C:
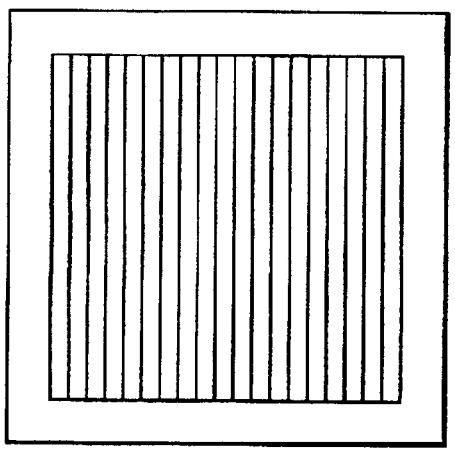
Figure 5D:
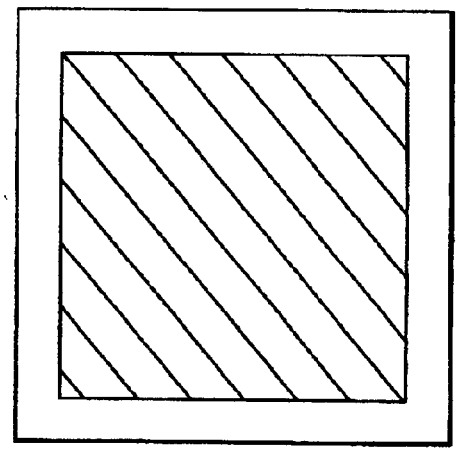

In place of the fine mesh pattern, other fine patterns having a defined outer periphery may also be used. For example, a stripe pattern with a defined outer periphery shown in FIG. 5C may be used, or as shown in FIG. 5D, an overlay measurement mark of a box type formed by patterning a partial transmission film into a square shape may be used.

Figure 6:
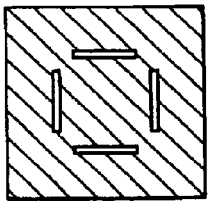
FIG. 6 is a table showing the structures of underlying patterns, the structures of overlay measurement mark margin patterns and testing areas of normal exposure amount reticles and the structures of overlay measurement mark areas of low exposure amount reticles, respectively used by the semiconductor device manufacture methods according to the fifth to seventh embodiments.

In the fifth to seventh embodiments shown in FIGS. 3 and 6, the overlay measurement mark margin pattern of the normal exposure amount reticle (overlay measurement mark margin pattern 15 shown in FIG. 1B) is made of a partial transmission film or fine patterns having the size equal to or smaller than the resolution limit. By using light weakened by transmitting through the overlay measurement mark margin pattern, the insufficient exposure amount of the overlay measurement mark transferred from the low exposure amount reticle can be compensated. It is therefore possible to resolve the overlay measurement mark by using the low exposure amount reticle.

In the fifth embodiment, the main overlay measurement mark is formed in an underlying layer and the subsidiary overlay measurement mark is resolved by using the low exposure amount reticle. It is therefore possible to evaluate a placement error between the underlying pattern and low exposure amount reticle.

In the sixth embodiment, the main overlay measurement mark of the underlying layer of the fifth embodiment is not formed, and the overlay measurement mark transferred from the low exposure amount reticle is utilized as the main overlay measurement mark for evaluating a placement error from the upper layer pattern.

In the seventh embodiment, the main overlay measurement mark is formed in the overlay measurement mark area of the normal exposure amount reticle, and the subsidiary overlay measurement mark is formed in the testing area of the low exposure amount reticle. Both the main overlay measurement mark and subsidiary mark are disposed in the light shield area. It is therefore possible to evaluate a placement error between the normal exposure amount reticle and low exposure amount reticle.

Instead of light-shielding the testing area of the normal exposure amount reticle of the fifth embodiment, a partial transmission film may be disposed in the testing area as the structure of an eleventh embodiment. The eleventh embodiment is effective for the case that the exposure amount of one shot by light transmitted through the partial transmission film cannot obtain a sufficient exposure amount. Instead of light-shielding the overlay measurement mark area of the normal exposure amount reticle of the sixth embodiment, a partial transmission film may be disposed in the overlay measurement mark area.

Figure 7:
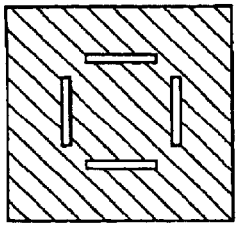
FIG. 7 is a table showing the structures of underlying patterns, the structures of overlay measurement mark areas of normal exposure amount reticles and the structures of overlay measurement mark margin patterns and overlay measurement mark areas of low exposure amount reticles, respectively used by the semiconductor device manufacture methods according to the eighth to tenth embodiments.

In the eighth to tenth embodiments shown in FIGS. 3 and 7, the whole area of the overlay measurement mark margin pattern of the normal exposure amount reticle is made as the light shield area, and the whole area of the overlay measurement mark margin pattern of the low exposure amount reticle is made as the transmission area. Light transmitted through the overlay measurement mark margin pattern of the low exposure amount reticle compensates for the insufficient exposure amount of the overlay measurement mark transferred from the low exposure amount reticle. Therefore, the eighth to tenth embodiments are effective for the case that the exposure amount of one shot for transferring the pattern of the low exposure amount reticle is equal to or larger than the development lower limit threshold value and smaller than the development lower limit threshold value.

In the eighth embodiment, a placement error between the underlying main overlay measurement mark and the subsidiary overlay measurement mark transferred from the low exposure amount reticle is detected. In the ninth embodiment, a placement error between the main overlay measurement mark transferred from the normal exposure amount reticle and the subsidiary overlay measurement mark transferred from the low exposure amount reticle is detected. In the tenth embodiment, the overlay measurement mark transferred from the low exposure amount reticle is used as the main overlay measurement mark for testing a placement error of the upper layer pattern.

In the eighth to tenth embodiments, although the whole area of the overlay measurement mark margin pattern of the low exposure amount reticle is made as the transmission area, the whole area of the overlay measurement mark margin may be formed with a partial transmission film as in twelfth to fourteenth embodiments. By using the partial transmission film instead of the perfect transmission area, an increase amount of the exposure amount can be adjusted.

In the third embodiment shown in FIG. 3, the whole area of the overlay measurement mark margin pattern of the normal exposure amount reticle is used as the shield area and the main overlay measurement mark is disposed in the partial transmission area. Instead, the whole area of the overlay measurement mark margin pattern is made as a partial transmission area as in the seventh embodiment.

In the modification of the third embodiment, the exposure amount of the area where the subsidiary mark is transferred is increased by light weakened by transmitting through the normal exposure amount reticle and light weakened by transmitting through the testing area. By adopting such a structure, the exposure amount can be increased sufficiently even if the transmission factors of the overlay measurement mark margin pattern of the normal exposure amount reticle and the partial transmission film formed in the overlay measurement mark area are low.

By using the embodiment method, overlay measurement marks were formed. In the following, a specific method of forming an overlay measurement mark and its evaluation method will be described.

On a silicon substrate on the surface of which circuit patterns are formed, a silicon oxide film of 3 nm in thickness and a polysilicon film of 200 nm in thickness were sequentially formed by chemical vapor deposition (CVD). A silicon nitride film of 30 nm in thickness was formed on the polysilicon film. This silicon nitride film functions as an antireflection film during exposure. On the surface of the silicon nitride film, KrF chemical sensitization type positive resist was coated to a thickness of 390 nm.

First exposure was performed by using a KrF halftone phase shift mask (corresponding to a normal exposure amount reticle). The transmission factor of the partial transmission film used by the halftone phase shift mask was 6%. The first exposure was preformed by oblique incidence zonal illumination using a zonal ray having an inner diameter of 0.375 and an outer diameter of 0.75 under the conditions of a numerical aperture NA of 0.60 and an exposure amount of 30 to 35 mJ/cm$^2$. The first exposure pertains to formation of all patterns disposed in the same layer as the gate electrode 21 shown in FIG. 2.

Next, second exposure was performed by using a KrF Levenson type phase shift mask (corresponding to a low exposure amount reticle). The second exposure was preformed under the conditions of a numerical aperture NA of 0.68, σ of 0.40 and an exposure amount of 10 to 11 mJ/cm$^2$. This second exposure pertains only to reduction of the gate length. The line width of the gate electrode pattern after reduction was about 100 nm.

Although an overlay measurement mark was formed by a conventional method, a subsidiary overlay measurement mark to be transferred by a Levenson type shift mask was not resolved sufficiently. This is because the exposure amount of the second exposure is insufficient. An overlay measurement mark was formed by the third embodiment shown in FIGS. 3 and 4, and the subsidiary overlay measurement mark to be formed by the Levenson type phase shift mask was resolved. Resist residue was not observed in the inside of the film-removed pattern of the overlay measurement mark. A placement error test can therefore be performed at a high precision.

When the exposure amount of the second exposure was set to 8 to 9 mJ/cm$^2$, thin resist residue was observed in the inside of the film-removed pattern of the subsidiary overlay measurement mark even if the third embodiment method was used. When the whole area of the overlay measurement mark margin pattern corresponding to the overlay measurement mark of a halftone phase shift mask was formed with a partial transmission area as in the modification of the third embodiment, a subsidiary overlay measurement mark without any residue was formed.

In the above example, although the overlay measurement mark for placement error test was formed, an alignment mark may be formed. It is preferable to transfer an alignment mark by using a Levenson type phase shift mask for gate length reduction, particularly when the upper layer pattern is aligned with the gate pattern having a reduced length. By using the embodiment method, it is possible to transfer an alignment mark by using a Levenson type phase shift mask which can be used at a low exposure amount.

The present invention has been described in connection with the preferred embodiments. The invention is not limited only to the above embodiments. It is apparent that various modifications, improvements, combinations, and the like can be made by those skilled in the art.

What we claim are:

1. A method of manufacturing a semiconductor device, comprising:
    a first exposure step of exposing a partial area of a resist film formed on a surface of a substrate to light having a first intensity, first and second areas being defined on the surface of the substrate, the partial area being above the first area, and the light having the first intensity having transmitted through an area on a first reticle where a pattern to be transferred is formed;
    a second exposure step of exposing the resist film above the second area of the substrate to light having a second intensity weaker than the first intensity, a third exposure step of exposing the resist film above the first and second areas to light having a third intensity weaker than the first intensity, the light having the third intensity having transmitted through an area of a second reticle where a pattern to be transferred is formed; and a developing step of developing the resist film exposed, wherein an exposure amount of the resist film above the second area in said second exposure step is an exposure amount unable to develop the resist film in said developing step, an exposure amount in said third exposure step is also an exposure amount unable to develop the resist film in said developing step, and in the second area a total of the exposure amount in said second exposure step and the exposure amount in said third exposure step is an exposure amount sufficient for developing the resist film in said developing step.

2. A method of manufacturing a semiconductor device according to claim 1, wherein in said second exposure step, at the same time when the resist film above the first area is exposed to the light in said first exposure step, light whose intensity was weakened by passing through a partial transmission area of the first reticle corresponding to the second area is applied to the resist film above the second area.

3. A method of manufacturing a semiconductor device according to claim 2, wherein: a first mark is formed on the substrate in the second area; a second mark is formed on the second reticle in an area corresponding to the second area; and the method further comprising a step of detecting a placement error between a pattern transferred from the second mark and the first mark, after said developing step.

4. A method of manufacturing a semiconductor device according to claim 3, wherein a partial transmission film is formed on the first reticle in an area corresponding to the second area, the partial transmission film partially absorbing exposure light and partially transmitting the exposure light.

5. A method of manufacturing a semiconductor device according to claim 3, wherein an area of the first reticle corresponding to the second area is structured by disposing a fine pattern whose size is equal to or smaller than the resolution limit in a light shield area.

6. A method of manufacturing a semiconductor device according to claim 3, wherein: a third mark is formed in an area of the first reticle corresponding to the second area; a fourth mark is formed in an area of the second reticle corresponding to the second area; and the method further comprising a step of detecting a placement error between a pattern transferred from the third mark and a pattern transferred from the fourth mark, after said developing step.

7. A method of manufacturing a semiconductor device according to claim 6, wherein an area of the first reticle corresponding to the second area is structured by disposing the third mark in an area having a partial transparent film for partially absorbing the exposure light and partially transmitting the exposure light.

8. A method of manufacturing a semiconductor device according to claim 6, wherein an outer periphery of the third mark is defined by a boundary between a light shield area and a light transmission area, and an inside of the third mark is structured by disposing fine light transmission areas and light shield areas.

9. A method of manufacturing a semiconductor device according to claim 6, wherein the first and second reticles are reticles for a reduction projection, a plurality of sections each exposed by one shot are defined on the surface of the substrate, an outer peripheral area of each section overlaps an outer peripheral area of a section adjacent to the first-mentioned section, this overlap area corresponds to the second area, when a first section among first and second sections adjacent to each other is exposed, each of mark areas of the first and second reticles corresponds to the second area in which the first and second sections overlap, when the second section is exposed, each of margin areas of the first and second reticles corresponds to the second area in which the first and second sections overlap, the third mark is disposed in the mark area of the first reticle, the fourth mark is disposed in the mark area of the second reticle, and an area of the margin area of the first reticle corresponding to an area including the pattern transferred from the fourth mark is the partial transmission area.

10. A method of manufacturing a semiconductor device according to claim 9, wherein the third mark is disposed in the partial transmission area in the mark area of the first reticle.

11. A method of manufacturing a semiconductor device according to claim 3, wherein the first and second reticles are reticles for a reduction projection, a plurality of sections each exposed by one shot are defined on the surface of the substrate, an outer peripheral area of each section overlaps an outer peripheral area of a section adjacent to the first-mentioned section, this overlap area corresponds to the second area, when a first section among first and second sections adjacent to each other is exposed, each of mark areas of the first and second reticles corresponds to the second area in which the first and second sections overlap, when the second section is exposed, each of margin areas of the first and second reticles corresponds to the second area in which the first and second sections overlap, the second mark is disposed in the mark area of the second reticle, and the partial transmission area of the first reticle is disposed in the mark area of the first reticle.

12. A method of manufacturing a semiconductor device according to claim 3, wherein the first and second reticles are reticles for a reduction projection, a plurality of sections each exposed by one shot are defined on the surface of the substrate, an outer peripheral area of each section overlaps an outer peripheral area of a section adjacent to the first-mentioned section, this overlap area corresponds to the second area, when a first section among first and second sections adjacent to each other is exposed, each of mark areas of the first and second reticles corresponds to the second area in which the first and second sections overlap, when the second section is exposed, each of margin areas of the first and second reticles corresponds to the second area in which the first and second sections overlap, the second mark is disposed in the mark area of the second reticle, and the partial transmission area of the first reticle is disposed in the margin area of the first reticle.

13. A method of manufacturing a semiconductor device according to claim 1, wherein: the first and second reticles are reticles for a reduction projection, a plurality of sections each exposed by one shot are defined on the surface of the substrate, an outer peripheral area of each section overlaps an outer peripheral area of a section adjacent to the first-mentioned section, this overlap area corresponds to the second area, when a first section among first and second sections adjacent to each other is exposed, each of mark areas of the first and second reticles corresponds to the second area in which the first and second sections overlap, when the second section is exposed, each of margin areas of the first and second reticles corresponds to the second area in which the first and second sections overlap, a third mark is formed in the mark area of the second reticle, an area of the margin area of the second reticle corresponding to an area including a pattern transferred from the third mark on the surface of the substrate is a light transmission area for transmitting exposure light; and in said second exposure step, the resist film above the second area is exposed to light having transmitted through the light transmission area in the margin area of the second reticle.

14. A reticle set for semiconductor device manufacture, comprising:

first and second reticles for exposing one layer formed on a substrate having a plurality of sections defined on a surface of the substrate, each section being exposed by one shot, an outer peripheral area of each section overlapping an outer peripheral area of a section adjacent to the first-mentioned section, this overlap area corresponding to a scribe line; and wherein:

when a first section among first and second sections adjacent to each other is exposed, each of mark areas of the first and second reticles corresponds to the scribe line corresponding to the overlap area of the first and second sections, when the second section is exposed, each of margin areas of the first and second reticles corresponds to the scribe line corresponding to the overlap area of the first and second sections;

a fifth mark is disposed in the mark area of the second reticle; and an area of the mark area of the first reticle corresponding to an area including a pattern transferred from the fifth mark on the substrate is a partial transmission area for partially transmitting exposure light.

15. A reticle set for semiconductor device manufacture according to claim 14, wherein an area of the margin area of the first reticle corresponding to an area including the pattern, on the substrate, transferred from the fifth mark is a light-shielding area.

16. A reticle set for semiconductor device manufacture according to claim 14, wherein a sixth mark is formed in the partial transmission area in the mark area of the first reticle, the sixth mark being used for transferring a pattern for testing a placement error from the pattern transferred from the fifth mark.

17. A reticle set for semiconductor device manufacture, comprising:

first and second reticles for exposing one layer formed on a substrate having a plurality of sections defined on a surface of the substrate, each section being exposed by one shot, an outer peripheral area of each section overlapping an outer peripheral area of a section adjacent to the first-mentioned section, this overlap area corresponding to a scribe line; and wherein:

when a first section among first and second sections adjacent to each other is exposed, each of mark areas of the first and second reticles corresponds to the scribe line corresponding to the overlap area of the first and second sections, when the second section is exposed, each of margin areas of the first and second reticles corresponds to the scribe line corresponding to the overlap area of the first and second sections;

a seventh mark is disposed in the mark area of the second reticle; and an area of the margin area of the first reticle corresponding to an area including a pattern, on the substrate, transferred from the seventh mark is a partial transmission area for partially transmitting exposure light.

18. A reticle set for semiconductor device manufacture, comprising:

first and second reticles for exposing a resist layer formed on a surface of a substrate having a plurality of sections defined on the surface of the substrate, each section being exposed by one shot, an outer peripheral area of each section overlapping an outer peripheral area of a section adjacent to the first-mentioned section, this overlap area corresponding to a scribe line; and wherein:

when a first section among first and second sections adjacent to each other is exposed, each of mark areas of the first and second reticles corresponds to the scribe line corresponding to the overlap area of the first and second sections, when the second section is exposed, each of margin areas of the first and second reticles corresponds to the scribe line corresponding to the overlap area of the first and second sections;

said first reticle is formed with a pattern for exposing the resist film to light having an intensity supplying an exposure amount equal to or larger than a threshold level of developing the resist film, and said second reticle is being formed with a pattern for exposing the resist film to light having an intensity supplying an exposure amount lower than the threshold level; and an eighth mark is disposed in the mark area of said second reticle, and an area of the margin area corresponding to an area including a pattern, on the substrate, transferred from the eighth mark is a partial transmission area for partially transmitting exposure light.

19. A method of manufacturing a semiconductor device according to claim 1, wherein: the first and second reticles are reticles for a reduction projection, a plurality of sections each exposed by one shot are defined on the surface of the substrate, an outer peripheral area of each section overlaps an outer peripheral area of a section adjacent to the first-mentioned section, this overlap area corresponds to the second area, when a first section among first and second sections adjacent to each other is exposed, each of mark areas of the first and second reticles corresponds to the second area in which the first and second sections overlap, when the second section is exposed, each of margin areas of the first and second reticles corresponds to the second area in which the first and second sections overlap, a ninth mark being formed in the mark area of the second reticle, an area of the margin area of the second reticle corresponding to an area including a pattern, on the substrate, transferred from the ninth mark is a partial transmission area for partially transmitting exposure light; and wherein in said second exposure step, the resist film above the second area is exposed to light having transmitted through the partial transmission area in the margin area of the second reticle.

20. A reticle set for semiconductor device manufacture, comprising:

first and second reticles for exposing a resist layer formed on a surface of a substrate having a plurality of sections defined on the surface of the substrate, each section being exposed by one shot, an outer peripheral area of each section overlapping an outer peripheral area of a section adjacent to the first-mentioned section, this overlap area corresponding to a scribe line; and wherein:
when a first section among first and second sections adjacent to each other is exposed, each of mark areas of the first and second reticles corresponds to the scribe line corresponding to the overlap area of the first and second sections, when the second section is exposed, each of margin areas of the first and second reticles corresponds to the scribe line corresponding to the overlap area of the first and second sections;

said first reticle is formed with a pattern for exposing the resist film to light having an intensity supplying an exposure amount equal to or larger than a threshold level of developing the resist film, and said second reticle is being formed with a pattern for exposing the resist film to light having an intensity supplying an exposure amount lower than the threshold level; and a tenth mark is disposed in the mark area of said second reticle, and an area of the margin area corresponding to an area including a pattern, on the substrate, transferred from the tenth mark is a partial transmission area for partially transmitting exposure light.

21. A method of manufacturing a semiconductor device according to claim 2, wherein the first and second reticles are reticles for a reduction projection, a plurality of sections each exposed by one shot are defined on the surface of the substrate, an outer peripheral area of each section overlaps an outer peripheral area of a section adjacent to the first-mentioned section, this overlap area corresponds to the second area, when a first section among first and second sections adjacent to each other is exposed, each of mark areas of the first and second reticles corresponds to the second area in which the first and second sections overlap, when the second section is exposed, each of margin areas of the first and second reticles corresponds to the second area in which the first and second sections overlap, an eleventh mark is being formed in the mark area of the second reticle, and at least two areas of an area of the margin area of the first reticle corresponding to an area including a pattern transferred from the eleventh mark, an area of the mark area of the first reticle corresponding to an area including a pattern transferred from the eleventh mark, and an area of the margin area of the second reticle corresponding to an area including a pattern transferred from the eleventh mark, are partial transmission areas for transmitting a portion of exposure light.

22. A method of manufacturing a semiconductor device according to claim 1, wherein: the first and second reticles are reticles for a reduction projection, a plurality of sections each exposed by one shot are defined on the surface of the substrate, an outer peripheral area of each section overlaps an outer peripheral area of a section adjacent to the first-mentioned section, this overlap area corresponds to the second area, when a first section among first and second sections adjacent to each other is exposed, each of mark areas of the first and second reticles corresponds to the second area in which the first and second sections overlap, when the second section is exposed, each of margin areas of the first and second reticles corresponds to the second area in which the first and second sections overlap, a twelfth mark is formed in the mark area of the second reticle, an area of the mark area of the first reticle corresponding to an area including a pattern transferred from the twelfth mark is a partial transmission area; and wherein the method further comprising a step of detecting a placement error between a main overlay measurement mark transferred from the twelfth mark and a subsidiary overlay measurement mark formed in an upper layer than the main overlay measurement mark, after said developing step.

23. A method of manufacturing a semiconductor device according to claim 1, wherein: the first and second reticles are reticles for a reduction projection aligner, a plurality of sections each exposed by one shot are defined on the surface of the substrate, an outer peripheral area of each section overlaps an outer peripheral area of a section adjacent to the first-mentioned section, this overlap area corresponds to the second area, when a first section among first and second sections adjacent to each other is exposed, each of mark areas of the first and second reticles corresponds to the second area in which the first and second sections overlap, when the second section is exposed, each of margin areas of the first and second reticles corresponds to the second area in which the first and second sections overlap, a thirteenth mark is formed in the mark area of the second reticle, an area of the margin area of the first reticle corresponding to an area including a pattern transferred from the thirteenth mark is a partial transmission area; and wherein the method further comprising a step of testing a placement error between a main overlay measurement mark transferred from the thirteenth mark and a subsidiary overlay measurement mark formed in an upper layer than the main overlay measurement mark, after said developing step.

24. A method of manufacturing a semiconductor device according to claim 1, wherein: the first and second reticles are reticles for a reduction projection aligner, a plurality of sections each exposed by one shot are defined on the surface of the substrate, an outer peripheral area of each section overlaps an outer peripheral area of a section adjacent to the first-mentioned section, this overlap area corresponds to the second area, when a first section among first and second sections adjacent to each other is exposed, each of mark areas of the first and second reticles corresponds to the second area in which the first and second sections overlap, when the second section is exposed, each of margin areas of the first and second reticles corresponds to the second area in which the first and second sections overlap, a fourteenth mark is being formed in the mark area of the second reticle, an area of the margin area of the second reticle corresponding to an area including a pattern transferred from the fourteenth mark is a partial transmission area; and wherein the method further comprising a step of detecting a placement error between a main overlay measurement mark transferred from the fourteenth mark and a subsidiary overlay measurement mark formed in an upper layer than the main overlay measurement mark, after said developing step.

* * * * *